(12) United States Patent
Kwok et al.

(10) Patent No.: US 9,166,197 B2
(45) Date of Patent: Oct. 20, 2015

(54) METALLIC ANODE TREATED BY CARBON TETRAFLUORIDE PLASMA FOR ORGANIC LIGHT EMITTING DEVICE

(75) Inventors: Hoi Sing Kwok, Kowloon (HK); Man Wong, Sai Kung (HK); Huajun Peng, Kowloon (HK); Jiaxin Sun, Kowloon (HK)

(73) Assignee: The Hong Kong University of Science and Technology, Kowloon (HK)

( * ) Notice: Subject to any disclaimer, the term of this patent is extended or adjusted under 35 U.S.C. 154(b) by 1160 days.

(21) Appl. No.: 11/479,773

(22) Filed: Jun. 29, 2006

(65) Prior Publication Data

US 2007/0046183 A1  Mar. 1, 2007

Related U.S. Application Data

(60) Provisional application No. 60/711,803, filed on Aug. 29, 2005.

(51) Int. Cl.
*H01L 51/52* (2006.01)

(52) U.S. Cl.
CPC ........ *H01L 51/5265* (2013.01); *H01L 51/5206* (2013.01)

(58) Field of Classification Search
CPC .................. H01L 51/5265; H01L 51/5206
USPC .................................................. 313/498–512
See application file for complete search history.

(56) References Cited

U.S. PATENT DOCUMENTS

| 5,780,174 | A | 7/1998 | Tokito et al. |
| 5,949,187 | A | 9/1999 | Xu et al. |
| 5,969,475 | A | 10/1999 | Friend et al. |
| 6,208,075 | B1 | 3/2001 | Hung et al. |
| 6,326,224 | B1 | 12/2001 | Xu et al. |
| 6,406,801 | B1 | 6/2002 | Tokito et al. |
| 6,621,840 | B2 | 9/2003 | Araki |
| 6,639,250 | B1 | 10/2003 | Shimoda et al. |
| 6,812,637 | B2 | 11/2004 | Cok et al. |
| 6,861,800 | B2 | 3/2005 | Tyan et al. |
| 7,049,741 | B2 * | 5/2006 | Madathil et al. .............. 313/504 |
| 7,402,947 | B2 | 7/2008 | Kwok et al. |
| 2004/0114061 | A1 * | 6/2004 | Kimura et al. .................. 349/45 |
| 2004/0149984 | A1 * | 8/2004 | Tyan et al. ...................... 257/40 |
| 2005/0029933 | A1 * | 2/2005 | Liao et al. ...................... 313/504 |
| 2005/0162074 | A1 * | 7/2005 | Madathil et al. .............. 313/504 |
| 2005/0208330 | A1 * | 9/2005 | Raychaudhuri et al. ...... 428/690 |

(Continued)

FOREIGN PATENT DOCUMENTS

KR  2001057125  *  7/2001

OTHER PUBLICATIONS

Applied Physics Letter, vol. 78, No. 5, Jan. 29, 2001. Anode modification in organic light emitting diodes by low-frequency plasma polymerization of CHF3., L.S.Hung,L.R. Zheng, M.G.Mason.*
I-M Chan, F.N.C-Hong/ Thin solid films, 2003, 254-259,444.*
Peng, "Design and fabrication of high efficiency organic light emitting diodes," pp. 168-169, Doctoral thesis submitted to the Hong Kong University of Science and Technology (Sep. 2005).

(Continued)

*Primary Examiner* — Anh Mai
*Assistant Examiner* — Fatima Farokhrooz
(74) *Attorney, Agent, or Firm* — Leydig, Voit & Mayer, Ltd.

(57) ABSTRACT

The invention provides an organic light emitting diode (OLED), having a substrate, an anode layer of silver or gold, wherein the anode layer is treated with $CF_4$ plasma to enhance the hole injection of the semitransparent anode layer.

19 Claims, 8 Drawing Sheets

(56) References Cited

U.S. PATENT DOCUMENTS

| | | | |
|---|---|---|---|
| 2005/0253131 A1* | 11/2005 | Kobayashi | 257/13 |
| 2006/0006795 A1* | 1/2006 | Strip | 313/504 |
| 2006/0088729 A1* | 4/2006 | Begley et al. | 428/690 |
| 2006/0158098 A1* | 7/2006 | Raychaudhuri et al. | 313/503 |
| 2009/0053491 A1* | 2/2009 | Loboda et al. | 428/216 |

OTHER PUBLICATIONS

Visser et al., "Surface and bulk compositional characterization of plasma-polymerized fluorocarbons prepared from hexafluoroethane and acetylene or butadiene reactant gases," J. Appl. Polymer Sci., 66: 409-421 (1997).

\* cited by examiner

METALLIC ANODE TREATED BY CARBON TETRAFLUORIDE PLASMA FOR ORGANIC LIGHT EMITTING DEVICE

CROSS-REFERENCE TO RELATED APPLICATION

This application claims the benefit of U.S. Provisional Patent Application Ser. No. 60/711,803, filed Aug. 29, 2005, the entire contents of which is included by reference herein.

FIELD OF THE INVENTION

The present invention relates to Organic Light Emitting Diode (OLED) displays. In particular, it provides microcavity organic light emitting diodes that use a metallic electrode as an anode and provides methods to fabricate such devices.

BACKGROUND OF THE INVENTION

One important parameter of an OLED device is the outcoupling efficiency, which is the fraction of the internally emitted photons that actually escape outside. Although conventional bottom LED engineering is rather mature, in general up to 80% of generated light is still unavailable for viewing, due to the losses in waveguiding modes, in the glass, ITO and organic layers and in surface plasmon modes in the metallic cathode.

One method that potentially can enhance the light outcoupling efficiency of an OLED device involves a microcavity structure, in which the organic EL elements are sandwiched between two reflecting mirrors, one of which is semitransparent, to let light escape. In most reported cases, a Quarter Wave Stack (QWS) is used as the semi-transparent reflector. A QWS, however, is a complicated structure and expensive to fabricate. In addition, a separated transparent electrode layer, usually an Indium Tin Oxide (ITO), is layered between the QWS and the organic layers, which further complicates the structure.

For active matrix OLED displays, a top emitting structure is preferred because the aperture ratio of the entire device can be significantly increased in this structure compared with that of the bottom emitting OLED structure. In a top emitting OLED, a highly reflective metal reflector is used in the anode structure to reflect the light back toward the cathode. In most reported cases, the reflecting metals have a high work function or are covered with a layer of transparent conductive oxide, e.g., ITO, which acts as carrier injection electrode.

U.S. Pat. No. 5,780,174 A1 (Tokito) provides a micro-optical resonator type organic electroluminescent device utilizing an organic electroluminescent material high in emission efficiency but broad in emission spectrum width, which a micro-optical resonator is formed by a multi-layered mirror and a metal mirror.

U.S. Pat. No. 5,949,187 (Xu) relates to an OED with a first microcavity including a first transparent spacer positioned adjacent the diode light output and a first mirror stack positioned on the first spacer to reflect light back into the OED and to define an optical length of the first microcavity. The optical length of the first microcavity emits light of a first spectrum. A second microcavity including a second transparent spacer is positioned adjacent the first microcavity and a second mirror stack positioned on the second spacer to reflect light toward the first microcavity and to define an optical length of the second microcavity.

U.S. Pat. No. 5,969,475 (Friend) discusses a light-emitting cavity device comprising a pair of mirrors spaced apart to define a resonant cavity; a luminescent layer located in the cavity and a control layer located in the cavity and controllable to adjust the resonance wavelength of the cavity and thereby spectrally redistribute the energy emitted by the luminescent layer.

U.S. Pat. No. 6,326,224 (Xu) relates to a method of purifying a primary color including providing an organic light emitting diode having a diode light output with a broad spectrum that includes a fraction of the primary color. The device includes a microcavity structure formed in cooperation with the organic light emitting diode to define an optical length of the microcavity structure, such that light emitted from the microcavity structure is the purified primary color.

U.S. Pat. No. 6,406,801 B1 (Tokito) discusses an optical resonator type organic electroluminescent element with a multilayered film mirror, a transparent electrode, an electron hole transportation layer, a luminescent layer configuring an organic layer, and a metallic electrode mirror formed on a glass substrate, which amplifies a specific wavelength (especially, in a range of about 30 nm toward a shorter wavelength side from a luminescence peak wavelength of the organic layer) in luminescence light by a minute optical resonator, which comprises the multilayered film mirror and the metallic electrode mirror.

U.S. Pat. No. 6,621,840 (Araki) is directed to a micro-optical resonator type organic light-emitting device comprising a substrate, a multi-layered thin film, a transparent electrode, an organic light-emitting layer, and a back electrode disposed on the substrate. If 0-mode resonance wavelength of the organic light-emitting device is expressed by $\lambda_0$, n-mode resonance wavelength of the organic light-emitting device is expressed by $\lambda_n$ (in which n is a positive integer) and reflectivity of the multi-layered thin film against light having a wavelength $\lambda$ is expressed by $R_\lambda$, $R_{\lambda 0}$ is 40% or more and $R_{\lambda 1}$ or $R_{\lambda 2}$ is 30% or less.

U.S. Pat. No. 6,639,250 (Shimoda) discusses a multiple-wavelength light emitting device comprising a light emitting layer for emitting light containing wavelength components to be output, a negative electrode that is positioned at the back surface of the light emitting layer and that transmits at least a portion of the light, reflecting layers positioned at the back surface of the negative electrode, for reflecting light having specific wavelengths, which reflecting layers are stacked in order perpendicularly to the light axis, in correspondence with the wavelengths of the light to be reflected, thus configuring a reflecting layer group. Divisions are made, in the direction perpendicular to the light axis, in any of at least two or more light emission regions that reflect light of different wavelengths. In each light emission region, the distance between the reflecting surface of the reflecting layer on the semi-transparent side and the reflecting surface in the semi-reflecting layer 2 is adjusted so that it becomes a resonating optical path length for the light that is emitted in the light emission region.

U.S. Pat. No. 6,812,637 (Cok) provides a top emitting OLED display, which includes a substrate; a patterned electrode formed above the substrate, defining a plurality of light emitting elements having gaps between the light emitting elements; a layer of OLED material disposed above the patterned electrode; a continuous transparent electrode disposed above the layer of OLED material; and a light-absorbing auxiliary electrode that is thermally and electrically conductive and in electrical and thermal contact with the continuous transparent electrode and located over the gaps between the light emitting elements of the display.

U.S. Pat. No. 6,861,800 (Tyan) discloses a color organic light-emitting display device having an array of pixels divided into at least two different color pixel sets, each color pixel set emitting a different predetermined color light over a common substrate, wherein each pixel in the array includes a metallic bottom-electrode layer disposed over the substrate and a metallic electrode layer spaced from the metallic bottom-electrode layer.

Notwithstanding significant improvements in LED and OLED technology, there exists a need for improved efficiency in light transmissions or outcoupling efficiency.

SUMMARY OF THE INVENTION

The present invention provides a metallic electrode, including Ag or Au or the alloy thereof, to function as the anode in OLEDs. The present invention modifies the surface of the metallic anode with $CF_4$ plasma to enhance the ability of carrier, especially the hole injection into the emissive unit. The present invention also provides an easily fabricated microcavity OLED using the metallic electrode as a reflective mirror.

Microcavity OLEDs using metallic anode are simpler in structure and easier to fabricate than those using a QWS, with elimination of: (1) deposition of multilayer dielectric stacks; and (2) the need for a separate transparent conductive anode. The microcavity OLED devices using this metallic electrode as an anode have substantially improved outcoupling efficiency, compared with that of a conventional bottom emitting device without a microcavity.

BRIEF DESCRIPTION OF THE DRAWINGS

Other features, aspects, and advantages of the invention can be understood by reviewing the following detailed description of the preferred embodiments, taken in connection with the attached drawings in which.

DETAILED DESCRIPTION OF THE PREFERRED EMBODIMENTS

The present invention provides: (1) a microcavity bottom emitting OLED using a semitransparent metal layer as an anode; and (2) a microcavity top emitting OLED using a highly reflective metal as the anode. The invention further provides a method to modify the surface of the metal to improve the carrier injection, especially the hole injection, and therefore the electrical and optical performance of the device being fabricated. The output efficiency of the microcavity OLED devices is significantly improved compared with that of a conventional bottom emitting device without a microcavity.

Figure 1:
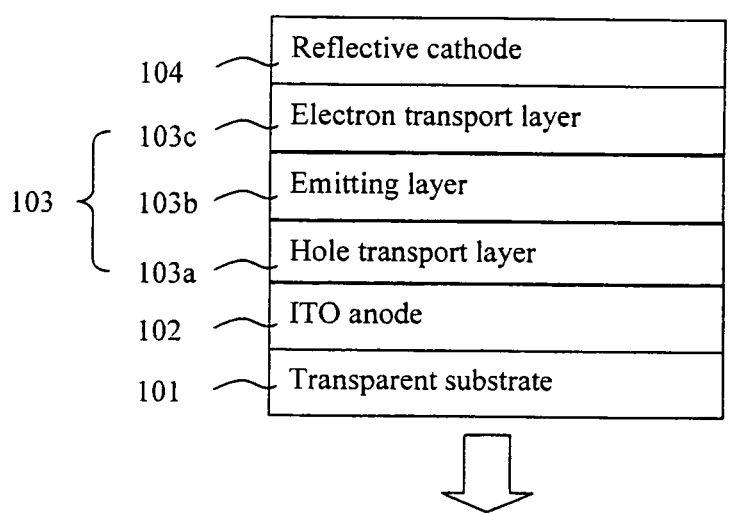
FIG. 1 is a schematic drawing of the layer structure of a conventional bottom emitting OLED.

FIG. 1 shows schematically the layer structure of a conventional bottom emitting OLED 100, including substrate 101, transparent anode 102, organic EL element 103, and highly reflective cathode 104. The organic EL element 103 has a hole transporting layer (HTL) 103a, emitting layer (ETL) 103b, and electron transport layer (ETL) 103c. The light passes through the transparent anode layer 102 and the substrate 101 at the bottom.

Figure 2:
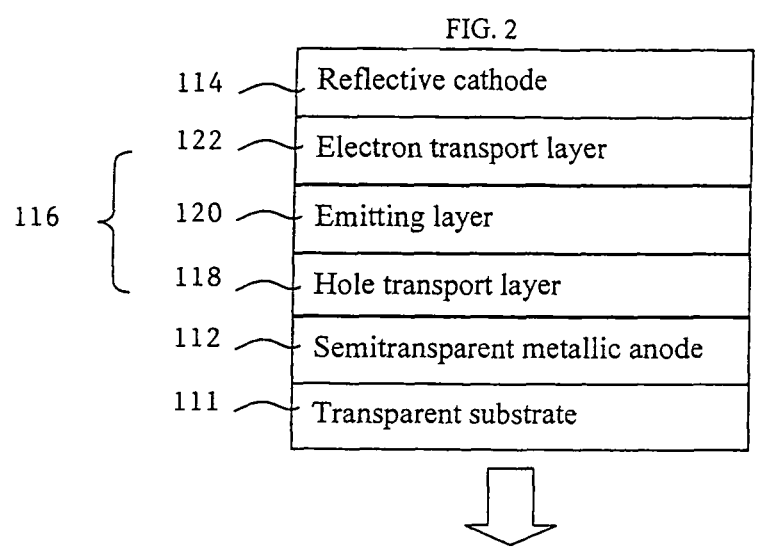
FIG. 2 is a schematic drawing of the layer structure of a bottom emitting OLED incorporating the present invention.

FIG. 2 shows schematically the layer structure of a bottom emitting microcavity OLED 110 of the present invention. In OLED 110, the anode includes a semitransparent metal anode layer 112. Light passes through the semitransparent anode layer 112 and the substrate 111 at the bottom. Anode 112 is a weakly absorbing film and has significant transmittance at the emission wavelength. In OLED 110, the highly reflective cathode 114 and the semitransparent anode 112 function as the reflective mirrors of the microcavity OLED 110. The absorption of the anode 112 is less than 20% and the layer thickness is in the range between 10 nm to 60 nm. The thickness of the anode 112 is selected to optimize the light output efficiency of the OLED 110. The semitransparent metallic anode 112 is Ag, Au, or alloys thereof. The surface of the anode 112 is modified by $CF_4$ plasma in accordance with the present invention, so as to enhance the hole injection into the organic layer from the anode 112.

It should be noted that microcavity OLED 110 can be tuned by selecting the combined thickness of the organic EL element 106 to modify the output efficiency as well as the emission spectrum. Enhanced output efficiency and purified light emission need to be balanced by selecting appropriate thickness of organic EL element 116, which includes the hole transport layer 118, the emitting layer 120, and the electron transport layer 122.

Figure 3:
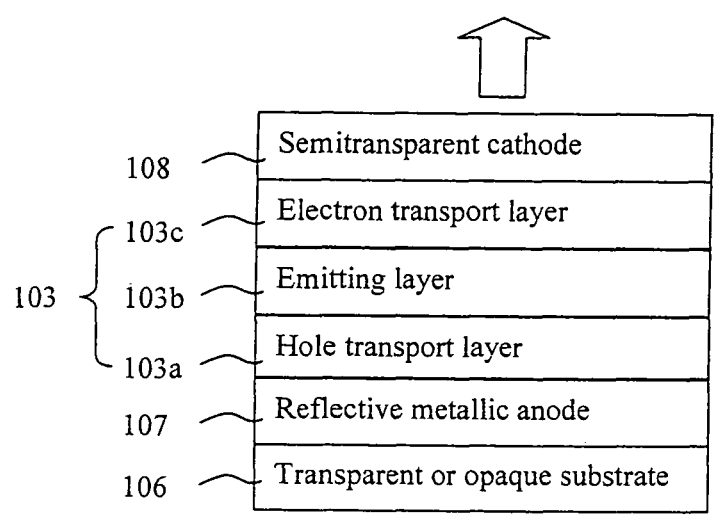
FIG. 3 is a schematic drawing of the layer structure of a top emitting microactivity OLED of the present invention.

FIG. 3 shows schematically the layer structure of a top emitting microcavity OLED 130 of the present invention. In OLED 130, a conducting reflecting anode 132 is a fully reflective layer deposited over a transparent or opaque substrate 131. The light passes through the semitransparent cathode 134. Cathode 134 is a weakly absorbing film and has significant transmittance at the emission wavelength. In OLED 130, the highly reflective anode 132 and the semitransparent cathode 134 function as the reflective mirrors of the top emitting microcavity OLED 130. The surface of the anode 132 is modified by $CF_4$ plasma in accordance with the present invention, so as to enhance the hole injection into the organic layer from the anode. The organic layer 136 includes a hole transport layer 138, an emitting layer 140, and an electron transport layer 142.

EXAMPLES

The following examples are presented for a further understanding of the present invention, and should not be considered limiting. The materials and layers formed thereof will be abbreviated as follows:

ITO: indium-tin-oxide;
$CF_4$: carbon tetrafluoride gas;
NPB: 4,4'-N,N'-di(naphthalene-1-yl)-N,N'-diphenyl-benzidine;
$Alq_3$: tris(8-hydroxyquinoline)aluminium(III);
C545T: 10-(2-benzothiazolyl)-1,1,7,7-tetramethyl-2,3,6,7-tetrahydro-1H,5H,11H-benzo[1]pyrano[6,7,8-ij]quinolizin-11-one;

BCP: 2,9-Dimethyl-4,7-diphenyl-1,10-phenanthroline;
CBP: 4,4'-Bis(carbazol-9-yl)biphenyl;
Ir(ppy)$_3$: tris(2-phenylpyridine)iridium;
mCP: 9H-carbazole-9,9'-(1,3-phenylene)-bis-(9C1);
TPBi: 2,2',2"-(1,3,5-benzinetriyl)tris(1-phenyl-1-H-benzimidazole);
(btp)$_2$Ir(acac): bis{2-[2'-benzo(4,5-a)thienyl]pyridinato-N, C$^{3'}$}.

Conventional devices were fabricated using a 1.1 mm thick glass substrate having a commercial grade 75-nm thick, 25 ohm/sq patterned ITO layer. The substrate was first cleaned ultrasonically in detergent and rinsed in distilled water, then baked in an oven. After cleaning, a layer of 1-nm metal fluoride layer was formed on the ITO surface by treated ITO using CF$_4$-plasma for 10 seconds. This metal fluoride can act as HIL to enhance the hole injection from ITO to organic layer. The substrates for devices of the present invention were made using a glass plate upon which was deposited a metal layer by thermal evaporation. This metallized glass substrate was also treated under the CF$_4$-plasma under the same conditions as for ITO. The substrates were then transferred to a multi-chamber vacuum system operating at pressure less than $1 \times 10^{-6}$ torr, where the organic stack of HTL, EML, ETL were deposited in sequence. After organic layer deposition, the substrates were moved to another vacuum chamber without breaking the vacuum. A cathode layer of LiF/Al for bottom emitting device or LiF/Al/Ag for top emitting device was then deposited through a shadow mask.

Current density (J)-Voltage (V)-Luminance (L) characteristics and were measured using an HP 4145B semiconductor parameter analyzer and a photodiode. The quantum efficiency of the device was measured directly by placing the device about 2 mm over the photodiode. The spectral characterization and the luminance calibration of the photodiode were performed with a PhotoResearch PR650 spectroradiometer. The voltage drop on the ITO electrode series resistance was substracted from the measured voltage.

The plasma pretreatment is carried out in a parallel plate reactor with the CF$_4$ at 10 Pa and 20 W using a DC generator. The treatment time is in the range of 5 secs-1 min. The reactor chamber is first pumped down to a base pressure below $10^{-5}$ Torr. The gas flow is controlled to be 50 sccm with a mass flow control (MFC). The plasma pretreatments, strongly modifying the anode surfaces of both bottom emitting and top emitting OLEDs, have a minor effect on the anodes thickness. The metal with thickness in a range of 10-50 nm will considered to be semi-transparent.

Example 1

A comparative device (1A) and a device (1B) of present invention each having an Ag anode layer were made. The Ag anodes were deposited on a 1.1 thick bare glass sheet with thickness of 60 nm. The Ag anode of the device 1B was treated by CF$_4$ plasma in a plasma treatment chamber in accordance with the present invention. Then the following layers were deposited in the following manner from a heated boat in the vacuum chamber under a vacuum less than $1 \times 10^{-6}$ torr:
(1) a hole-transporting layer, consisting of 140 nm NPB; and
(2) a cathode layer, consisting of 110 nm Al.

Figure 4:
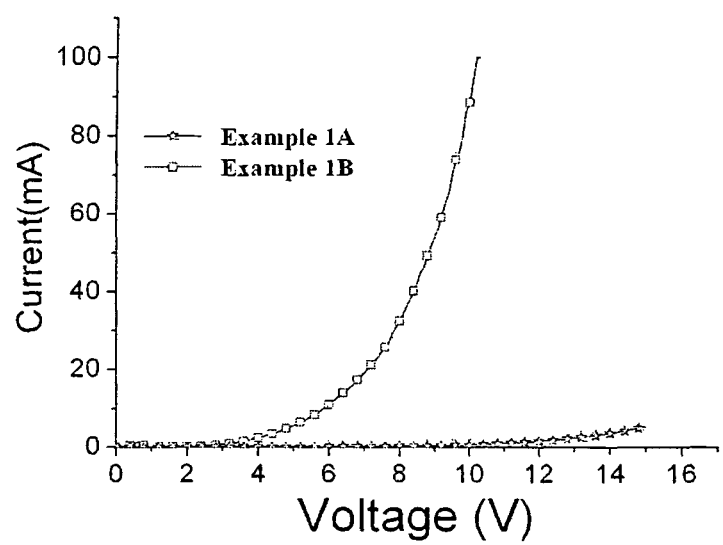
FIG. 4 is a graph showing the current voltage relationship of the devices described in Examples 1A and 1B.

FIG. 4 shows the current voltage relationships of the devices described in Example 1A and Example 1B. The figure shows that when the Ag anode is modified by the CF$_4$ plasma, the device shows fast-rising J-V curve and low operation driving voltage, as compared to those obtained from comparative device 1A.

Example 2

A conventional bottom emitting OLED was made using ITO as the transparent anode. After routine cleaning, the ITO was treated with CF$_4$ plasma in a plasma treatment chamber. Then, the following layers were deposited in the following sequence from a heated boat in the vacuum chamber under a vacuum of less than $1 \times 10^{-6}$ torr:
(1) a hole-transporting layer, of 70 nm NPB;
(2) a light emitting layer, of 30 nm Alq doped with 1% C545T;
(3) a electron transport layer, of 30 nm Alq; and
(4) a cathode layer, of 1 nm LiF covered with 110 nm Al.

The device structure is Glass/ITO (75 nm)/NPB (70 nm)/Alq: 1% C545T (30 nm)/Alq (30 nm)/LiF (1 nm)/Al (110 nm).

Example 3

A series of bottom emitting OLEDs of the present invention (devices 3A, 3B, 3C, 3D, and 3E), each having an Ag anode were made. The Ag anodes were deposited on a 1.1 nm thick bare glass sheet with thickness varying from 15 nm to 50 nm. The Ag anode surface was treated by CF$_4$ plasma in a plasma treatment chamber. Then the following layers were deposited in the following sequence from a heated boat in the vacuum chamber under a vacuum less than $1 \times 10^{-6}$ torr:
(1) a hole-transporting layer, of 50 nm NPB;
(2) a light emitting layer, of 24 nm Alq doped with 1% C545T;
(3) a electron transport layer, of 24 nm Alq; and
(4) a cathode layer, of 1 nm LiF covered with 110 nm Al.

The device structure is Glass/Ag (x nm)/NPB (50 nm)/Alq: 1% C545T (24 nm)/Alq (30 nm)/LiF (1 nm)/Al (110 nm).

The results of Examples 2 and 3 are listed in Table 1 attached hereto. Devices having a semitransparent Ag anode of present invention demonstrate a luminance efficiency that is higher than that of the comparative device of Example 2. The highest luminance efficiency is obtained from the device with 25 nm Ag anode, about 2 times the efficiency of the comparative device.

Figure 5:
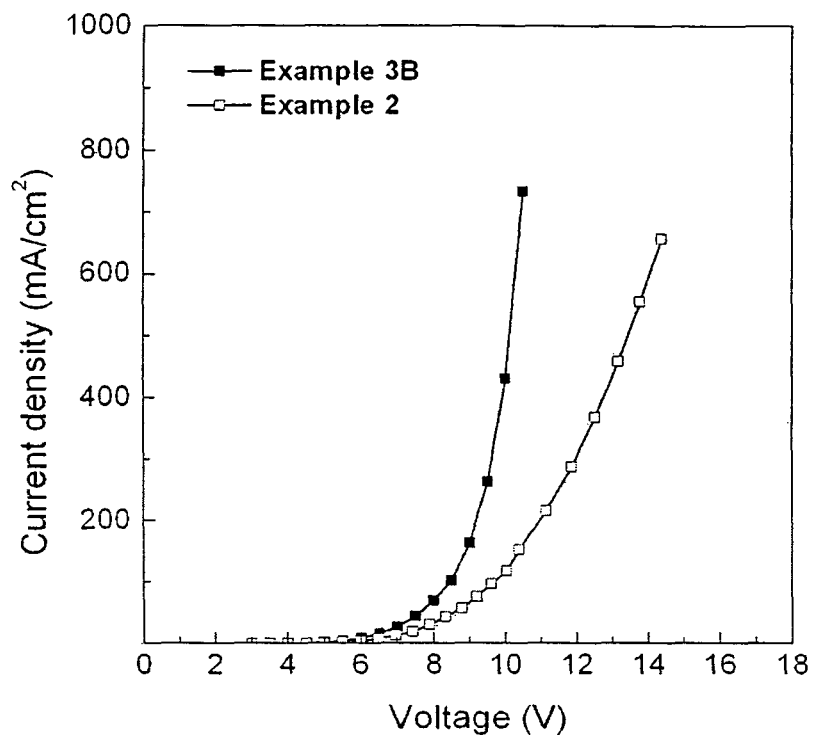
FIG. 5 is a graph of the current density of (J) as a function of driving voltage of the devices discussed in Example 2 and 3B.

FIG. 5 shows the current density (J) as a function of driving voltages of the devices described in Example 2 and Example 3B. It can be seen from the figure that using the Ag anode modified by the CF$_4$ plasma, the device shows fast-rising J-V curve and low operation driving voltage, as compared to those obtained from device of Example 2.

Example 4

A conventional bottom emitting OLED was made using ITO as the transparent anode. After routine cleaning, the ITO was treated under CF$_4$ plasma in a plasma treatment chamber. Then the substrate was transferred to a multi-chamber vacuum system for thin film deposition. The following layers were deposited in the following sequence from a heated boat in the vacuum chamber under a vacuum less than $1 \times 10^{-6}$ torr:
(1) a hole-transporting layer, 70 nm thick, of NPB;
(2) a light emitting layer, 20 nm thick, of CBP doped with 8% Ir(ppy)$_3$;
(3) an electron transport layer, 40 nm thick, of TPBi; and
(4) a cathode layer, of 1 nm LiF covered with 110 nm Al.

The device structure is Glass/ITO (75 nm)/NPB (70 nm)/CBP:8% Ir(ppy)$_3$(20 nm)/TPBi (40 nm)/LiF (1 nm)/Al (110 nm).

Example 5

Bottom emitting OLEDS of the present invention having an Ag anode were made. The Ag anodes were deposited on a 1.1 mm thick bare glass sheet with thickness of 25 nm. The Ag anode surface was treated by $CF_4$ plasma in a plasma treatment chamber. Then the substrates were transferred to a multi-chamber vacuum system for thin film deposition. The following layers were deposited in the following sequence from a heated boat in the vacuum chamber under a vacuum less than $1\times10^{-6}$ torr:
(1) a hole-transporting layer, 50 nm thick, of NPB;
(2) a light emitting layer, 20 nm thick, of CBP doped with 8% $Ir(ppy)_3$;
(3) an electron transport layer, 40 nm thick, of TPBi; and
(4) a cathode layer, of 1 nm LiF covered with 110 nm Al.

The device structure is Glass/Ag (25 nm)/NPB (50 nm)/CBP: 8% $Ir(ppy)_3$ (20 nm)/TPBi (40 nm)/LiF (1 nm)/Al (110 nm).

Figure 6A:
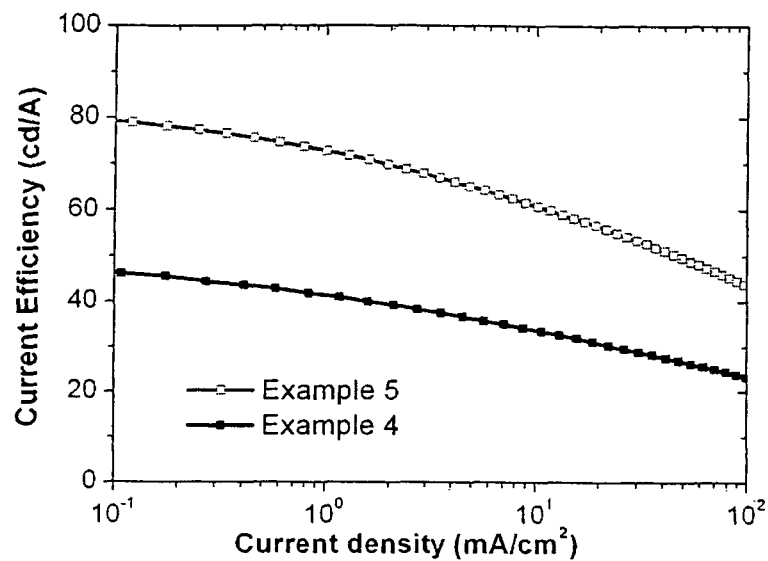
FIG. 6A is a graph of the current efficiency as a function of current density of the devices of Examples 4 and 5.

FIG. 6A shows the current efficiency of the devices described in Example 4 (comparative) and Example 5 (inventive) as a function of current density. The current efficiency of the devices of Examples 4 and 5 are about 46 cd/A and 79 cd/A respectively with a current density of 1 $mA/cm^2$.

Figure 6B:
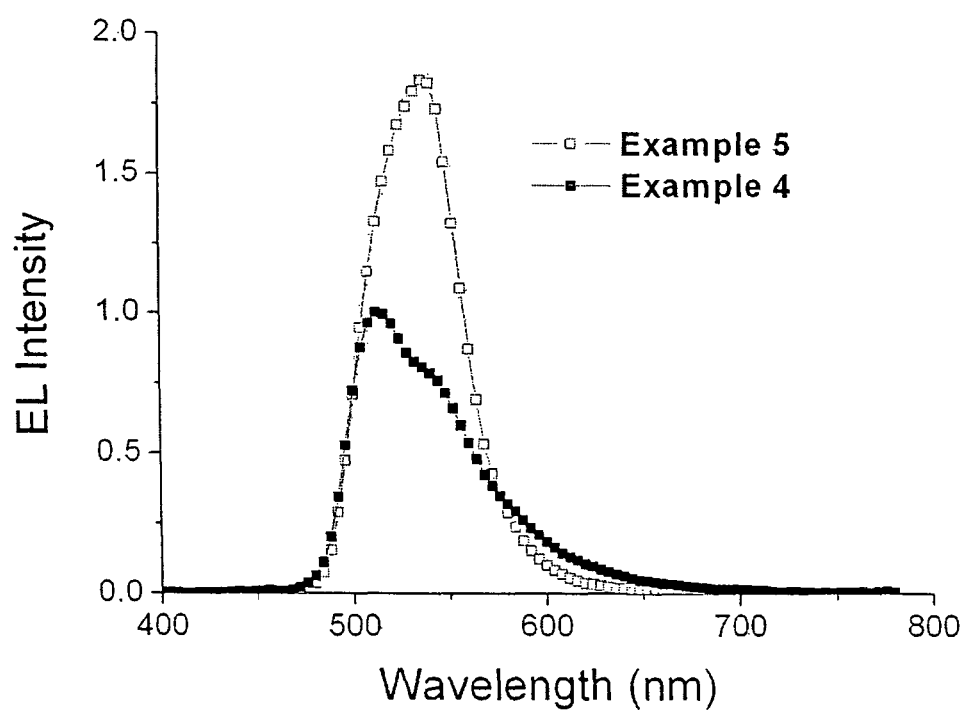
FIG. 6B shows emission spectra of the devices of Example 4 and 5 at a current density of 1 mA/cm2.

FIG. 6B shows the emission spectra of the devices of Examples 4 and 5 at a current density of 1 $mA/cm^2$. The color coordinates are CIE-x=0.285, CIE-y=0.627 for device 4 and CIE-x=0.253, CIE-y=0.689 for device 5.

Example 6

A conventional bottom emitting OLED was made using ITO as the transparent anode. After routine cleaning, the ITO was treated under $CF_4$ plasma in a plasma treatment chamber. Then the substrate was transferred to a multi-chamber vacuum system for thin film deposition. The following layers were deposited in the following sequence from a heated boat in the vacuum chamber under a vacuum less than $1\times10^{-6}$ torr:
(1) a hole-transporting layer, 70 nm thick, of NPB;
(2) a light emitting layer, 25 nm thick, of CBP doped with 7% $(btp)_2$ Ir (acac);
(3) an electron transport layer, 40 nm thick, of TPBi;
(4) a cathode layer, of 1 nm LiF covered with 110 nm Al.

The device structure is Glass/ITO (75 nm)/NPB (70 nm)/CBP: 7% $(btp)_2$ Ir (acac) (25 nm)/TPBi (40 nm)/LiF (1 nm)/Al (110 nm).

Example 7

Bottom emitting OLEDs of present invention having an Ag anode were made. The Ag anodes were deposited on a 1.1 mm thick bare glass sheet with thickness of 25 nm. The Ag anode surface was treated by $CF_4$ plasma in a plasma treatment chamber. Then the substrates were transferred to a multi-chamber vacuum system for thin film deposition. The following layers were deposited in the following sequence from a heated boat in the vacuum chamber under a vacuum less than $1\times10^{-6}$ torr:
(1) a hole-transporting layer, 50 nm thick, of NPB;
(2) a light emitting layer, 20 nm thick, of CBP doped with 7% (btp) Ir (acac),
(3) an electron transport layer, 42 nm thick, of TPBi; and
(4) a cathode layer, of 1 nm LiF covered with 110 nm Al.

The device structure is Glass/Ag (25 nm)/NPB (50 nm)/CBP:7% $(btp)_2$Ir (acac) (20 nm)/TPBi (42 nm)/LiF (1 nm)/Al (110 nm).

Figure 7A:
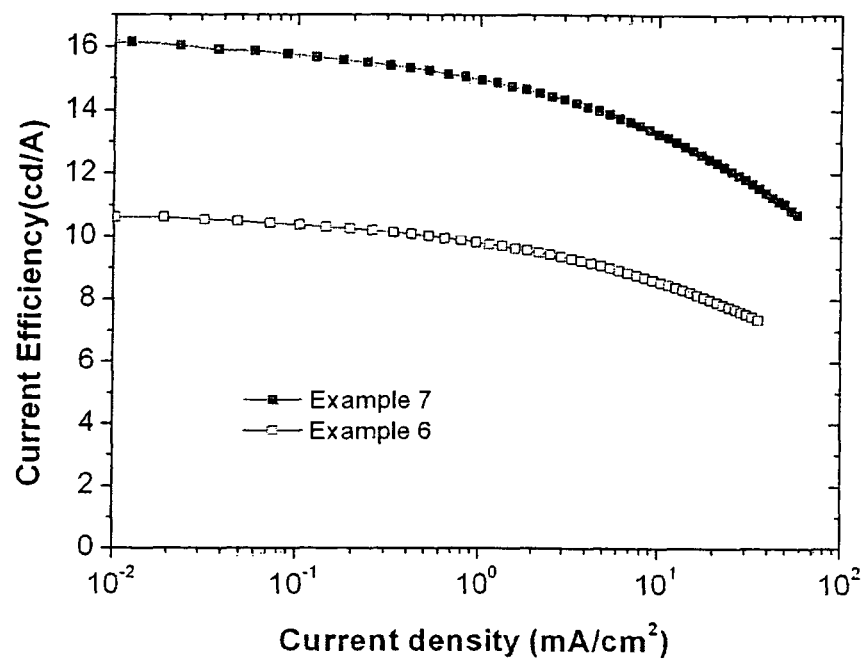
FIG. 7A is a graph of the current efficiency as a function of current density of the devices described in Examples 6 and 7.

FIG. 7A shows the current efficiency as a function of current density of the devices described in the Examples 6 and 7. The current efficiencies of these devices are about 10.2 cd/A and 15.4 cd/A respectively, at a current density of 1 $mA/cm^2$.

Figure 7B:
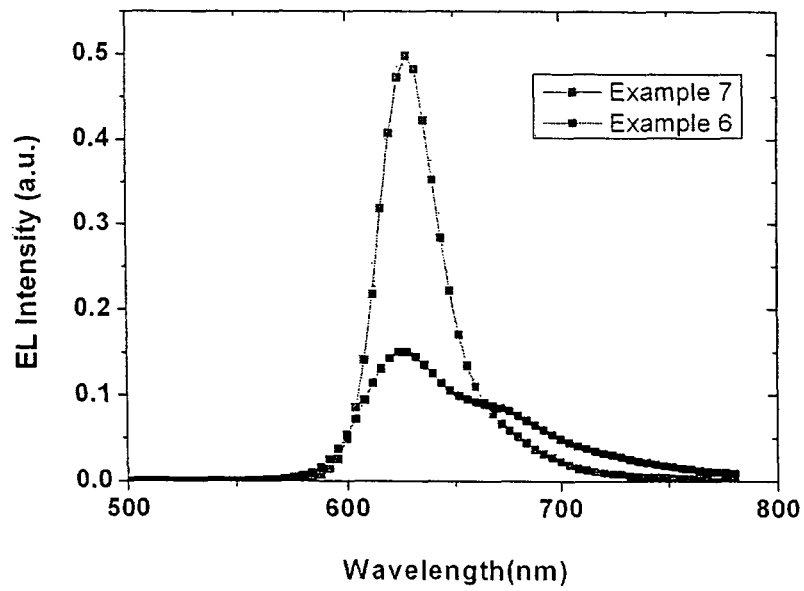
FIG. 7B shows the emission spectra devices of 6 and 7 at a current density of 1 $mA/cm^2$.

FIG. 7B shows the emission spectra of the devices in Example 6 and 7 at a current density of 1 $mA/cm^2$. The color coordinates are CIE-x=0.667, CIE-y=0.323 for Device 6 and CIE-x=0.682 CIE-y=0.316 for the device in Example 7.

Thus, the bottom emitting microcavity OLED according to the present invention shows a significantly improved efficiency and an improvement in color, compared with conventional bottom emitting devices without a microcavity.

Example 8

A top emitting OLED of the present invention using $CF_4$ pretreated Ag as anode was made. A bare glass sheet coated with 80 nm thick Ag was used as the starting substrate. The Ag anode surface was treated by $CF_4$ plasma in a plasma treatment chamber for 8 sec at the pressure of 10 Pa. Then, the following layers were deposited in the following sequence from a heated boat in the vacuum chamber under a vacuum less than $1\times10^{-6}$ torr:
(1) a hole-transporting layer, 50 nm thick, of NPB;
(2) a light emitting layer, 30 nm thick, of Alq doped with 1% C545T;
(3) a electron transport layer, 25 nm thick, of Alq; and
(4) a cathode layer, of 1 nm LiF, 2 nm Al and 20 nm Ag on top.

The device structure is Glass/Ag (80 nm)/NPB (50 nm)/Alq: 1% C545T (30 nm)/Alq (25 nm)/LiF (1 nm)/Al (2 nm)/Ag (20 nm).

Figure 8:
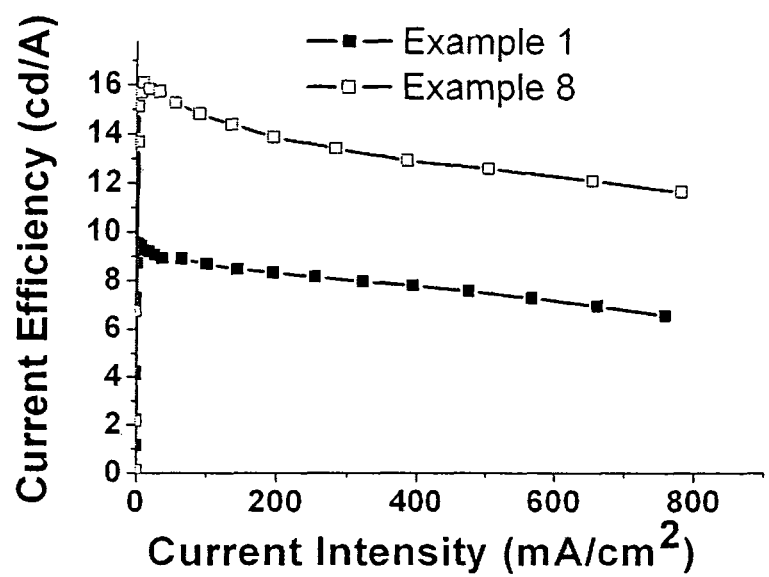
FIG. 8 shows the luminance efficiency as a function of current density of the devices described in Examples 2 and 8.

FIG. 8 shows the luminance efficiency as a function of current density of the devices described in Examples 2 and 8. The luminance efficiencies of devices 2 and 7 are about 9.3 cd/A and 15.8 cd/A respectively, at a current density of 20 $mA/cm^2$. It can be seen that the top emitting microcavity OLED according to the present invention shows a significant improvement in luminance output.

The invention has been described in detail with certain preferred embodiments thereof, but it will be understood that variations and modifications can be effected without departing from the scope of the invention.

We claim:

1. A bottom-emitting microcavity organic light-emitting diode (OLED) device, comprising:
 (a) a transparent substrate;
 (b) a semitransparent conductive anode layer including a metal comprising at least one of Ag, Au and an alloy thereof, formed over the substrate;
 (c) a plurality of emissive units disposed between the anode and a reflective and conductive cathode, wherein the emissive units comprise at least a hole-transport layer and a electron-transport layer, and light is emitted through the anode and the substrate; and
 (d) said reflective and conductive cathode which includes a metal, an alloy or both deposited over the electron transport layer;
 wherein a metal surface of the anode is modified by treatment with $CF_4$ plasma and the hole transport layer is formed over the modified anode surface, to increase the hole injection ability of the metal in the anode to the adjacent hole.

2. The device of claim 1, wherein the anode comprises Ag and Au.

3. The device of claim 1, wherein the anode has a thickness between about 10 nm to about 50 nm.

4. The device of claim 1, wherein the $CF_4$ plasma is generated by an input DC electrical signal.

5. The device of claim 1, wherein the $CF_4$ plasma is generated by an input electrical signal at a radio frequency of between about 100 kHz and about 13.56 MHz.

6. The device of claim 1, wherein the anode is coated with $V_2O_5$, $MoO_3$, or $Pr_2O_3$ a metal oxide material.

7. A top-emitting microcavity organic light-emitting diode (OLED) device, comprising:
   (a) a transparent or opaque substrate;
   (b) a reflective, substantially opaque, and conductive anode including a metal comprising at least one of Ag, Au and an alloy thereof formed over the substrate, a metal surface of the anode having been modified by treatment with $CF_4$ plasma to increase the hole injection ability of the metal in the anode to an adjacent hole transport layer;
   (c) a plurality of emissive units disposed between the anode and a reflective, semitransparent and conductive cathode, wherein the emissive units comprise at least the hole-transport layer formed over the modified anode surface and an electron-transport layer; and
   (d) a reflective, semitransparent and conductive cathode including a metal, an alloy, or a combination thereof deposited over the electron transport layer such that light can be emitted through the cathode.

8. The device of claim 7, wherein the anode also comprises Pt or Ni.

9. The device of claim 7, wherein the anode comprises a stack of a first metal over a second metal, wherein the first metal is Al, Cu, Mo, Ti, Cr, Pt, Ni, Au or Ag, and the second metal is Au or Ag.

10. The device of claim 7, wherein the thickness of the cathode ranges from about 10 nm to about 50 nm.

11. The device of claim 7, wherein the $CF_4$ plasma is generated by an input DC electrical signal.

12. The device of claim 7, wherein the $CF_4$ plasma is generated by an input electrical signal at a radio frequency between about 100 kHz and about 13.56 MHz.

13. The device of claim 7, wherein the $CF_4$ plasma treatment time is between 1 second and 1 minute.

14. The device of claim 7, wherein the anode is coated with $V_2O_5$, $MoO_3$, or $Pr_2O_3$ so as to further enhance the ability of hole injection of the anode.

15. A method of making a bottom-emitting organic light-emitting diode (OLED) device, comprising:
   (a) providing a substrate;
   (b) applying a layer of Au or Ag to the substrate to form a semitransparent anode layer thereon; and
   (c) treating a metal surface of the semitransparent anode layer with $CF_4$ plasma for between 1 second and 1 minute to increase hole injection ability of the metal of the semitransparent anode layer to an adjacent hole transport layer, wherein the $CF_4$ plasma is generated by at least one of an input DC electrical signal and an input electrical signal at a radio frequency between about 100 kHz and about 13.56 MHz at approximately 20 W in a reactor, at a pressure of approximately 10 Pa.

16. A method of making a top-emitting organic light-emitting diode (OLED) device, comprising:
   (a) providing a substrate;
   (b) forming on the substrate an anode layer of Ag or Au;
   (c) treating a metal surface of the anode layer with $CF_4$ plasma for between 1 second and 1 minute, to increase hole injection ability of the metal of the semitransparent anode layer to an adjacent hole transport layer, wherein the $CF_4$ plasma is generated by at least one of an input DC electrical signal and an input electrical signal at a radio frequency between about 100 kHz and about 13.56 MHz at approximately 20 W in a reactor, at a pressure of approximately 10 Pa; and
   (d) depositing on the anode layer under vacuum the hole transport layer, a light emitting layer, an electron transport layer, and a semitransparent cathode layer of Ag or Au.

17. The method according to claim 16, wherein the anode is rendered semi-transparent by treatment with $CF_4$ plasma.

18. A bottom-emitting organic light-emitting diode (OLED) device made according to the method of claim 15.

19. A top-emitting organic light-emitting diode (OLED) device made according to the method of claim 16.

* * * * *